United States Patent
Kundarewich et al.

(10) Patent No.: US 11,106,851 B1
(45) Date of Patent: Aug. 31, 2021

(54) SERIALIZATION IN ELECTRONIC DESIGN AUTOMATION FLOWS

(71) Applicant: Xilinx, Inc., San Jose, CA (US)

(72) Inventors: Paul D. Kundarewich, Toronto (CA); Grigor S. Gasparyan, San Jose, CA (US); Mehrdad Eslami Dehkordi, Los Gatos, CA (US); Guenter Stenz, Niwot, CO (US); Xiao Dong, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/805,604

(22) Filed: Feb. 28, 2020

(51) Int. Cl.
*G06F 30/392* (2020.01)

(52) U.S. Cl.
CPC .................. *G06F 30/392* (2020.01)

(58) Field of Classification Search
CPC ..................................... G06F 30/392
USPC ......................................... 716/119
See application file for complete search history.

(56) References Cited

U.S. PATENT DOCUMENTS

| | | | |
|---|---|---|---|
| 2015/0363517 A1* | 12/2015 | Clark | G06F 30/392 716/103 |
| 2017/0212975 A1* | 7/2017 | Moore | G06F 30/327 |

OTHER PUBLICATIONS

Vivado Design Suite User Guide, UG904 (v2018.2) Jun. 22, 2018.

* cited by examiner

*Primary Examiner* — Eric D Lee
(74) *Attorney, Agent, or Firm* — Crawford Maunu PLLC

(57) ABSTRACT

Disclosed approaches for processing a circuit design include interrupting processing of a circuit design by an electronic design automation (EDA) tool at a selected phase of processing. The tool serializes EDA state data into serialized state data while processing is interrupted and writes the serialized state data for subsequent restoration of tool state. To resume processing at the point of interruption, the EDA tool can read the serialized state data and deserialize the serialized state data. The EDA tool bypasses one or more phases of processing after reading the serialized state data and thereafter resumes processing of the circuit design.

20 Claims, 6 Drawing Sheets

SERIALIZATION IN ELECTRONIC DESIGN AUTOMATION FLOWS

TECHNICAL FIELD

The disclosure generally relates to serialization of electronic design automation data.

BACKGROUND

A circuit design flow generally entails design capture, synthesis, mapping, place-and-route, and generation of implementation data for making or configuring a target integrated circuit (IC) device. Simulation steps can also be performed at various points in the design flow to evaluate correct behavior and performance.

The design flow is performed by electronic design automation (EDA) tools executing on a computer system. During the processing of the circuit design, the EDA tools save the processed state of the circuit design in one or more databases. The information in the databases describes, depending on the stage of the design flow, synthesized logic, mapping of logic to elements of a target device, placement data, routing data, etc.

In some scenarios, a designer may interrupt processing of an EDA tool in order to evaluate the partially complete results generated by the EDA tool. If no design changes are made, after evaluating the results the designer may desire to resume processing of the circuit design by the EDA tool. However, the saved state of the databases may not be sufficient to resume processing at the phase at which the EDA tool was interrupted. Thus, the EDA tool will restart processing of the circuit design anew in order to resume processing at the point in the design flow at which processing was interrupted. For example, the phases of a placer tool can include, in order, initialization, floorplanning, global placement, detailed placement, etc. If the placer tool is interrupted during global placement, the placer tool will repeat initialization, floorplanning, and global placement in order to return to the point of interruption. Repeating previously completed phases of processing can waste valuable time and computer resources.

SUMMARY

A disclosed method includes interrupting processing of a circuit design by an electronic design automation (EDA) tool executing on a computer system at a selected phase of a plurality of phases of processing. The method includes serializing EDA state data into serialized state data while processing by the EDA tool is interrupted and writing the serialized state data by the EDA tool. The EDA tool reads the serialized state data and deserializing the serialized state data into memory of the computer system by the EDA tool. After reading the serialized state data, the EDA tool bypasses one or more phases of processing of the plurality of phases of processing and then resumes processing of the circuit design at the selected phase.

A disclosed system includes a processor arrangement and a memory arrangement coupled to the processor arrangement. The memory arrangement is configured with instructions that when executed by the processor arrangement cause the processor arrangement to execute an electronic design automation (EDA) tool that performs operations including interrupting processing of a circuit design at a selected phase of a plurality of phases of processing. The EDA tool serializes the EDA state data into serialized state data while processing is interrupted and then writes the serialized state data. The EDA tool reads the serialized state data and deserializing the serialized state data into the memory arrangement. The EDA tool bypasses one or more phases of processing of the plurality of phases of processing after reading the serialized state data and resumes processing of the circuit design at the selected phase of processing.

Other features will be recognized from consideration of the Detailed Description and Claims, which follow.

BRIEF DESCRIPTION OF THE DRAWINGS

Various aspects and features of the method and system will become apparent upon review of the following detailed description and upon reference to the drawings in which.

DETAILED DESCRIPTION

Figure 1:
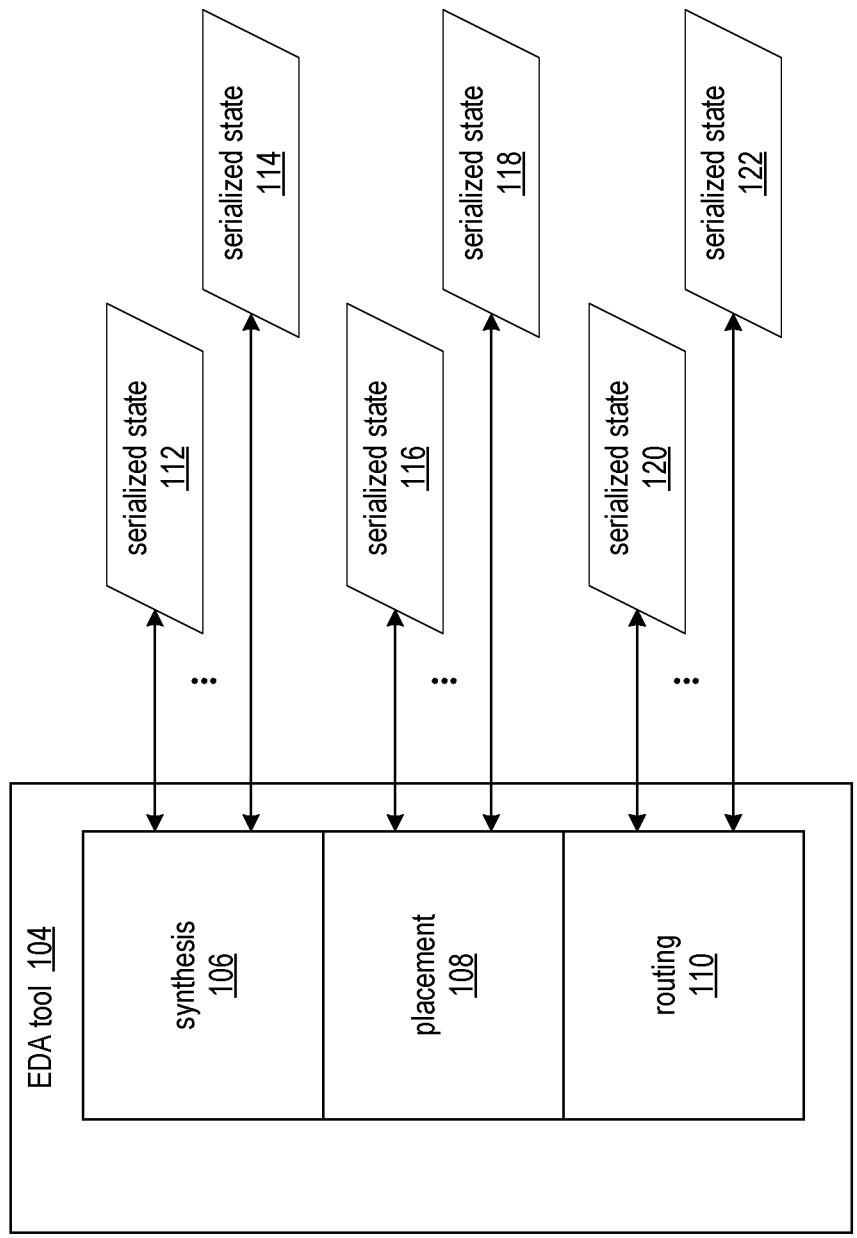
FIG. 1 shows exemplary phases of processing of a circuit design by an EDA tool and serialization of state data of the EDA tool in those phases.
Figure 1:
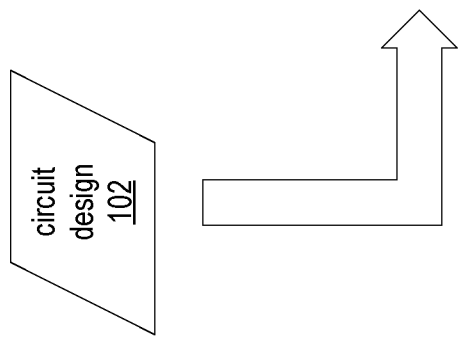

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosed methods and systems substantially reduce the demand for computer resources by EDA tools by serializing all EDA tool state data at various points in the design flow. Individual sets of serialized tool state data can be saved at different stages of the design flow at which the EDA tool serializes state data. By serializing the tool state data, the EDA tool can at a later time efficiently resume processing of the circuit design at a selected point in the processing by deserializing the appropriate set of serialized state data and continuing processing following deserialization. The disclosed methods and systems thereby avoid wasteful usage of computer resources exhibited by prior approaches in which processing is repeated for one or more stages of the design flow.

According to one or more disclosed approaches, an EDA tool interrupts processing of a circuit design at a selected phase of processing. While interrupted, processing of the circuit design is suspended and the EDA tool serializes state data. The tool state data can include all objects and states of those objects needed to restart the tool at the interrupted phase. The EDA tool writes the serialized state data such that the serialized state data can be deserialized and processing resumed. The writing of the serialized state data can be to a storage device, such as a RAM, magnetic disk, or solid state disk. Alternatively, the writing of the serialized data can be to one or more sockets, such as to communicate the serialized state data to one or more child processes.

At some time after the serialized data has been written, such as when a designer is ready to resume processing of the circuit design or when child processes of the tool can read the serialized data delivered through sockets or read from storage, the tool reads and deserializes the serialized state data. Once the serialized data has been deserialized, the objects and states of the objects of the EDA tool are ready for the tool to resume processing. The EDA tool can then bypass already-completed phases of processing and resume processing of the circuit design at the interrupted phase.

FIG. 1 shows exemplary phases 106, 108, and 110 of processing of a circuit design 102 by an EDA tool 104 and serialization of state data of the EDA tool in those phases. The EDA tool can be a suite of software tools that perform design capture, synthesis, placement, routing, generation of implementation data, and other related processing. The exemplary phases include synthesis phase 106, placement phase 108, and routing phase 110. Processing of the circuit design by the EDA tool can involve additional phases that are not shown.

Processing of the EDA tool 104 can be interrupted at one or more of the phases for serializing the state of the tool. Depending on implementation objectives, the EDA tool can be interrupted at multiple points in a phase for serialization. The exemplary EDA tool illustrates multiple serialization points in each of the synthesis phase 106, placement phase 108, and routing phase 110. For example, the synthesis phase 106 can be interrupted at multiple points, and the tool can generate sets of serialized state data 112, . . . , 114; the placement phase can be interrupted at multiple points and the tool can generate sets of serialized state data 116, . . . , 118; and the routing phase can be interrupted at multiple points and the tool can generate sets of serialized state data 120, . . . , 122.

The EDA tool performs serialization only at specifically programmed points during execution. That is, serialization cannot occur at any arbitrary time during execution. The phase and pre-programmed point at which processing is interrupted for serialization can be selected, for example, interactively by the user of the tool while the tool is executing or by parameters input by the user when the tool is started. When a user interactively signals interruption of the tool while the tool is executing, the tool can continue processing until the next programmed serialization point is reached. In response to a parameter input when the tool is started by a user, the tool processes the circuit design to the serialization point indicated by the parameter. When the EDA tool reaches the serialization point, which was selected by the tool in response to an interactive signal to interrupt processing or in response to an input parameter, the tool interrupts its processing. That is, the EDA tool suspends processing of the circuit design, and while the EDA tool has suspended processing in response to the signal to interrupt, the EDA tool serializes the state data. The EDA then writes the serialized state data to a destination such as to a storage device or a socket.

The serialized state data can be restored by the EDA tool to resume processing at the point at which the state data was saved or generated. In one scenario, the EDA tool can be restarted and instructed to restore a particular set of serialized state data, such as one of sets 112, . . . , 114, 116, . . . , 118, 120, . . . , 122. The tool reads the specified set serialized state data and deserializes the serialized state data. Once the state data has been restored to working memory of the EDA tool, the EDA tool bypasses design flow phases that were completed and resulted in the set of serialized state data that was restored. The EDA tool can then resume processing at the phase at which processing was interrupted.

A potential problem associated with serialization can arise from modifications to the EDA tool 104. For example, if a modification to the tool involves a modification to an object or data structure and the modification does not implement serialization of the modified object/data structure, the EDA tool will not properly serialize the tool state and the erroneous serialized state data can cause errors when the EDA tool restores the state data and attempts to resume processing.

To ensure that serialization is properly maintained through modifications to the EDA tool 104, a regression test tool compares the total size of objects and data structures of a modified component of the EDA tool to an expected size. If the size is not equal to the expected size, the component is rejected and an executable EDA tool cannot be built with the modified component.

Figure 2:
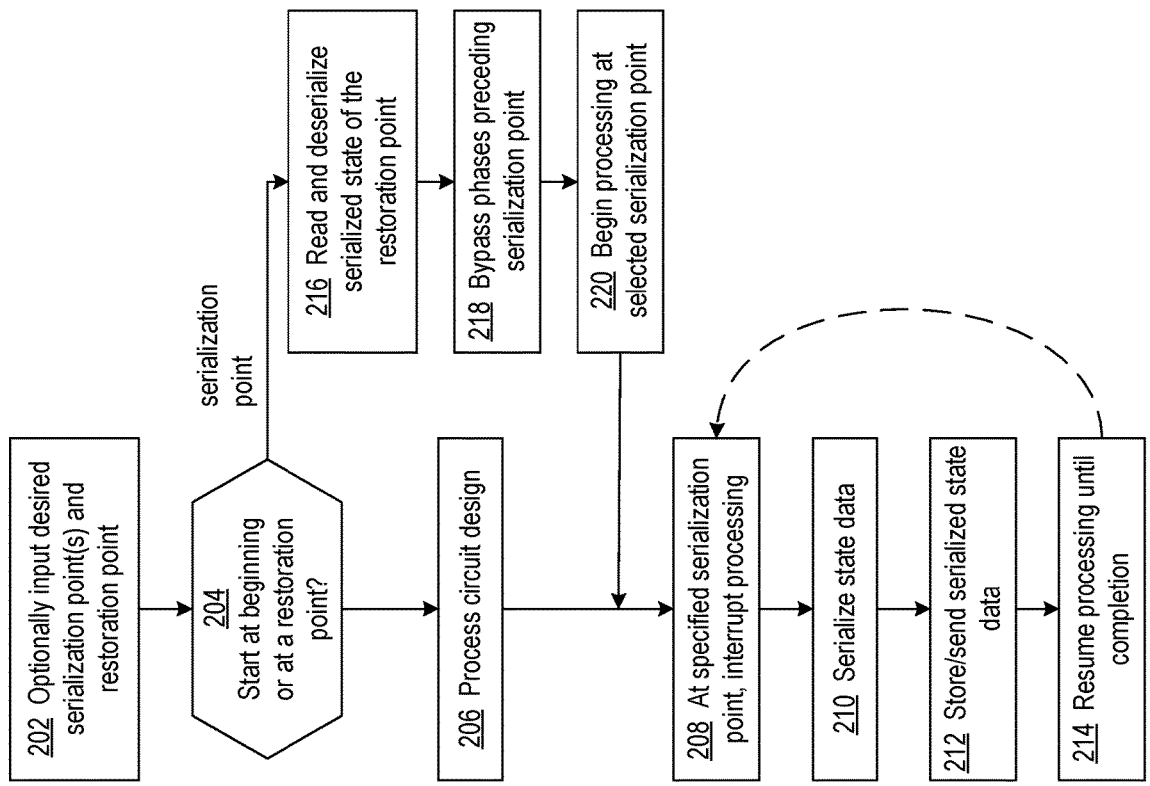
FIG. 2 shows a flowchart of an exemplary process of an EDA tool.

FIG. 2 shows a flowchart of an exemplary process of an EDA tool. At block 202 when the EDA tool initially begins executing, the EDA tool can optionally input one or more desired serialization points and/or a restoration point. Each specified serialization point indicates a phase or sub-phase at which the EDA tool should interrupt processing and serialize the state data of the tool. Examples of sub-phases of a phase include placer initialization, floorplanning, global placement, detailed placement, clock placement, and a variety of other mid-placement points. The optional restoration point indicates the phase or sub-phase at which the EDA tool is to resume processing, after first deserializing an associated set of serialized state data.

The terms "serialization point" and "restoration point" are used to delineate between the EDA tool serializing tool state at a certain point in processing and the tool deserializing previously serialized state data for resumption of processing at a certain point. However, it will be appreciated that a restoration point is the same point in tool processing as a serialization point at which state data was serialized.

Decision block 204 determines whether the EDA tool is to start processing the circuit design at an initial phase or is to start at a restoration point. If no restoration point was specified when the tool was started, processing of the circuit design commences at an initial phase of processing (e.g., logic synthesis) at block 206. Processing of the circuit design continues until the tool is interrupted.

Processing of the circuit design can be interrupted in response to either the tool reaching a serialization point that was specified as an input parameter or an interactively input interrupt signal from a user. In response to an input parameter that specifies interruption of processing for serialization, the EDA tool interrupts processing of the circuit design when processing reaches the serialization point identified by the parameter. In response to an interactively input interruption request from a user, the EDA tool continues processing until the next serialization point is reached. In interrupting processing, the design tool suspends processing of the circuit design.

At block 210, the tool serializes the state data. Serialization involves the translation of objects (or data structures) and states of the objects into a format that can be readily restored. The translated objects and state can be referred to as serialized state data. Depending on the application, the serialized state data can be stored in retentive storage for later retrieval or communicated to other EDA processes. A semantically identical copy of the original objects and states can be restored from the serialized state data in the same or different computing environment.

Serialization can be independent of a particular computer architecture. Hardware independence allows restoration of the serialized data in a computer architecture different from the computer architecture that performed the serialization. For example, the serialized data can be independent of the endianness of the source and destination computer systems.

A number of programming languages support serialization through standard application program interfaces or through syntactical constructs. Examples of such programming languages include Delphi, Java, Objective-C, PHP, Python, Ruby, Smalltalk, and the .NET framework. Various libraries support serialization in languages that do not offer direct support. Examples of serialization formats include Common Data Representation (CDR), JSON, Java serialization, Efficient XML Interchange (EXI), D-Bus Message Protocol, Pickle, SOAP, eXternal Data Representation (XDR), XML, and others.

The EDA tool at block 212 writes the serialized state data. In writing the serialized state data, the EDA tool can store the serialized state data in a storage arrangement or write the serialized state data to a socket for consumption by another process of the tool. When saving the serialized state data for restoration at a later time, the EDA tool can store identification data associated with the set of serialized state data. The identification data can identify the selected phase or sub-phase of processing at which the serialized state data was generated. The identification data can be used to select from multiple sets of serialized state data, the set associated with a specified restoration point.

At block 214, the tool can optionally resume processing until another interruption or until completion.

If a restoration point was specified to the EDA tool when the tool was started, decision block 204 directs the process to block 216. Based on the specified restoration point, the tool determines which set of serialized state data is associated with the restoration point. The tool can read the identification data associated with the sets of serialized state data to determine which set to deserialize. The EDA tool reads and deserializes the selected set of serialized state data at block 216.

At block 218, after deserializing the serialized state data and having restored the tool state, the EDA tool bypasses processing phases of the tool that were performed and produced the state data that was serialized. Having bypassed completed phases, the EDA tool resumes processing at block with the restored state.

Figure 3:
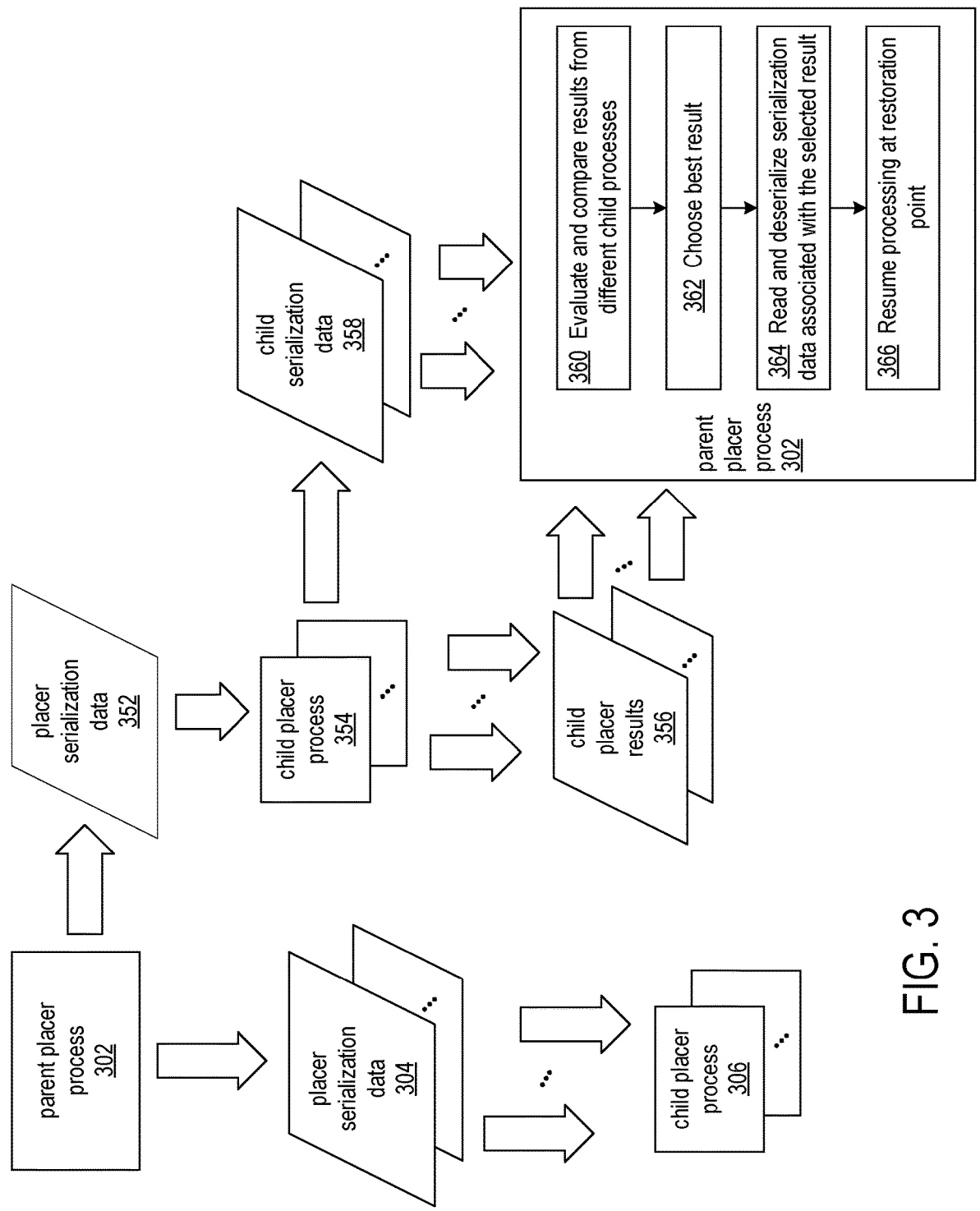
FIG. 3 shows processes of an EDA tool that uses serialization to efficiently communicate state information between processes of the tool.

FIG. 3 shows processes of an EDA tool that uses serialization to efficiently communicate state information between processes of the tool. Though the example of FIG. 3 shows parent and child processes that perform placement of a circuit design, the disclosed approaches can be adapted to communication between co-processes (as opposed to parent and child processes) and to communication between processes for phases other than placement.

An EDA tool can implement a parent placer process 302 that generates multiple sets of placer serialization data 304. Each set of placer serialization data can be specifically generated for communicating to one of multiple child placer processes 306. Each of the child processes can read one of the sets of serialized state data, deserialize the set of serialized state data, bypass initialization phases, and continue/resume processing of the circuit design at the point at which the parent placer generated the serialized state data.

In another aspect, the parent placer process can generate one set of placer serialization data 352 that is used by multiple child placer processes 354 executing in parallel, with each child placer process placing according to a different strategy. The best result generated by the child placer processes can be used by the parent placer process and subsequent design flow stages in continuing with the design flow.

As shown in FIG. 3, each of the child placer processes 354 generates respective child placer results 356. Each child process also generates respective sets of placer serialization data 358, each of which is associated with a respective one of the child placer results 356. In response to the child processes 354 completing execution, the parent placer process 302 evaluates and compares the child placer results 356 at block 360. The results can be evaluated based on the area of an integrated circuit die (or dice) occupied by the placed elements of the circuit design, based on meeting timing requirements, based on routability/congestion, and/or based on power consumption. At block 362, the parent placer process chooses the best result, such as the placement result that occupies the smallest area of a die, best meets timing requirements, has the least congestion, and/or consumes the least power. At block 364, the parent placement process reads and deserializes the one of the sets of placer serialization data 358 that is associated with the identified best result. The parent placer process can then resume processing at the restoration point as described above.

Figure 4:
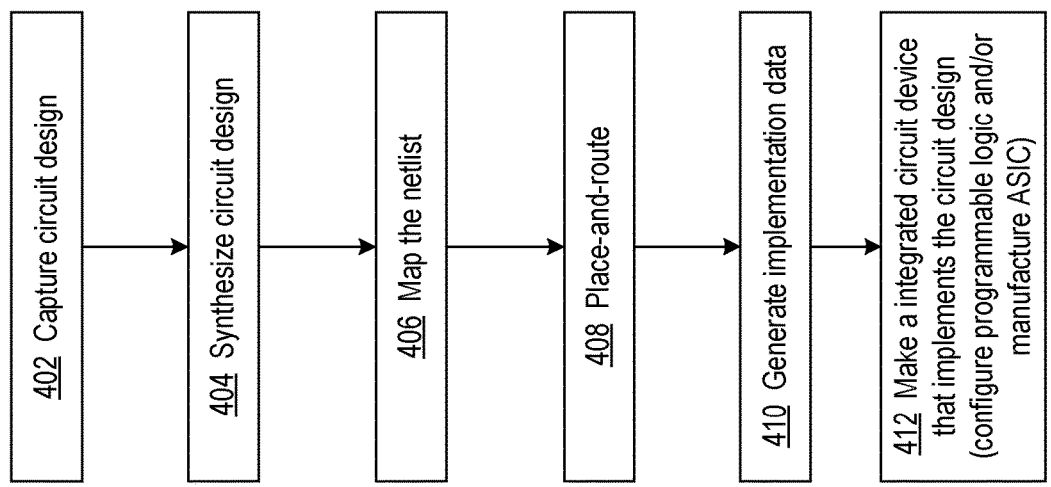
FIG. 4 shows a flowchart of a design flow for processing a circuit design consistent with the disclosed approaches for circuit design placement.

FIG. 4 shows a flowchart of a design flow for processing a circuit design consistent with the disclosed approaches for circuit design placement. The design flow can be supported by electronic design automation tools, such as the Vivado® design tool from XILNIX, Inc. At block 402, the design tool captures a circuit design, such as through a hardware description language or a graphical user interface having user-selectable and configurable function blocks. The circuit design can be synthesized at block 404 to produce a netlist, and at block 406 the netlist can be mapped to circuit structures that are available on a target IC device. At block 408, the netlist can be placed and routed. The place-and-route phase of the design flow is the phase in which the disclosed approaches for incremental initialization by parent and child placer processes can be employed.

At block 410, the design tool generates implementation data from the placed-and-routed circuit design. The implementation data can be suitable for configuring programmable logic and routing resources of an FPGA or suitable for fabricating an ASIC. At block 412, an IC device can be made based on the implementation data. The IC device can be made by configuring a programmable IC with configuration data or fabricating an ASIC.

Figure 5:
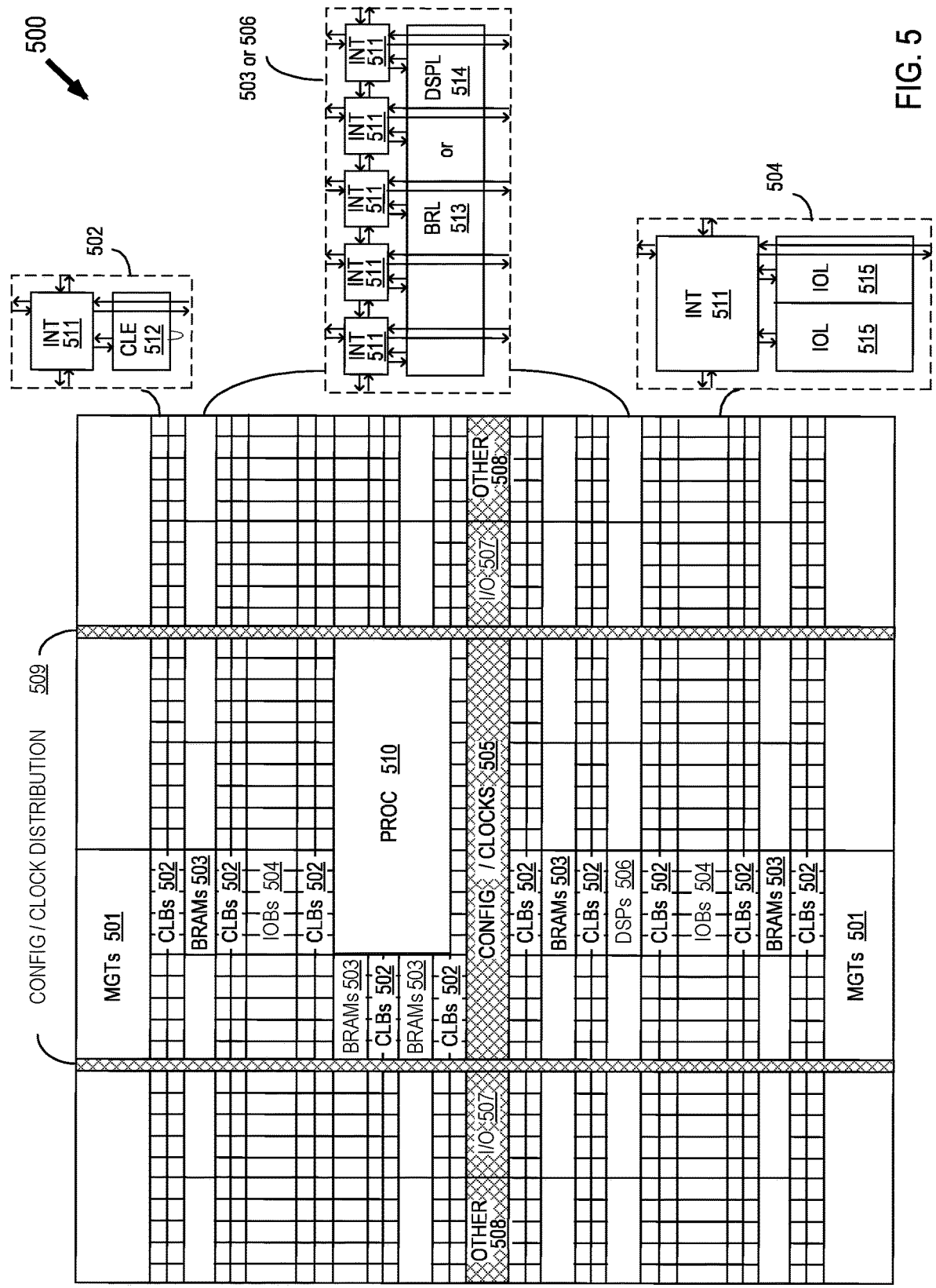
FIG. 5 shows a programmable integrated circuit (IC), which is an example of a target IC device that can be targeted by a design flow of a circuit design.

FIG. 5 shows a programmable integrated circuit (IC) 500, which is an example of a target IC device that can be targeted by a design flow of a circuit design. The programmable IC may also be referred to as a System On Chip (SOC) that includes field programmable gate array logic (FPGA) along with other programmable resources. FPGA logic may include several different types of programmable logic blocks in the array. For example, FIG. 5 illustrates programmable IC 500 that includes a large number of different programmable tiles including multi-gigabit transceivers (MGTs) 501, configurable logic blocks (CLBs) 502, random access memory blocks (BRAMs) 503, input/output blocks (IOBs) 504, configuration and clocking logic (CONFIG/CLOCKS) 505, digital signal processing blocks (DSPs) 506, specialized input/output blocks (I/O) 507, for example, clock ports, and other programmable logic 508 such as digital clock managers, analog-to-digital converters, system monitoring logic, and so forth. Some programmable IC having FPGA logic also include dedicated processor blocks (PROC) 510 and internal and external reconfiguration ports (not shown). Circuit designs processed according to the disclosed methods and systems can also be implemented as ASICs or on an adaptive compute acceleration platform (ACAP). An ACAP has FPGA fabric with distributed memory and hardware-programmable DSP blocks, a multi-core SoC, and one or more software programmable, yet hardware adaptable, compute engines, all connected through a network on chip (NoC).

In some FPGA logic, each programmable tile includes a programmable interconnect element (INT) 511 having standardized connections to and from a corresponding interconnect element in each adjacent tile. Therefore, the programmable interconnect elements taken together implement the programmable interconnect structure for the illustrated FPGA logic. The programmable interconnect element INT 511 also includes the connections to and from the programmable logic element within the same tile, as shown by the examples included at the top of FIG. 5.

For example, a CLB 502 can include a configurable logic element CLE 512 that can be programmed to implement user logic, plus a single programmable interconnect element INT 511. A BRAM 503 can include a BRAM logic element (BRL) 513 in addition to one or more programmable interconnect elements. Typically, the number of interconnect elements included in a tile depends on the height of the tile. The illustrated BRAM tile has the same height as five CLBs, but other numbers (e.g., four) can also be used. A DSP tile 506 can include a DSP logic element (DSPL) 514 in addition to an appropriate number of programmable interconnect elements. An 10B 504 can include, for example, two instances of an input/output logic element (IOL) 515 in addition to one instance of the programmable interconnect element INT 511. As will be clear to those of skill in the art, the actual I/O bond pads connected, for example, to the I/O logic element 515, are manufactured using metal layered above the various illustrated logic blocks, and typically are not confined to the area of the input/output logic element 515.

A columnar area near the center of the die (shown shaded in FIG. 5) is used for configuration, clock, and other control logic. Horizontal areas 509 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 5 include additional logic blocks that disrupt the regular columnar structure making up a large part of the programmable IC. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual programmable IC, more than one adjacent column of CLBs is typically included wherever the CLBs appear, to facilitate the efficient implementation of user logic.

Figure 6:
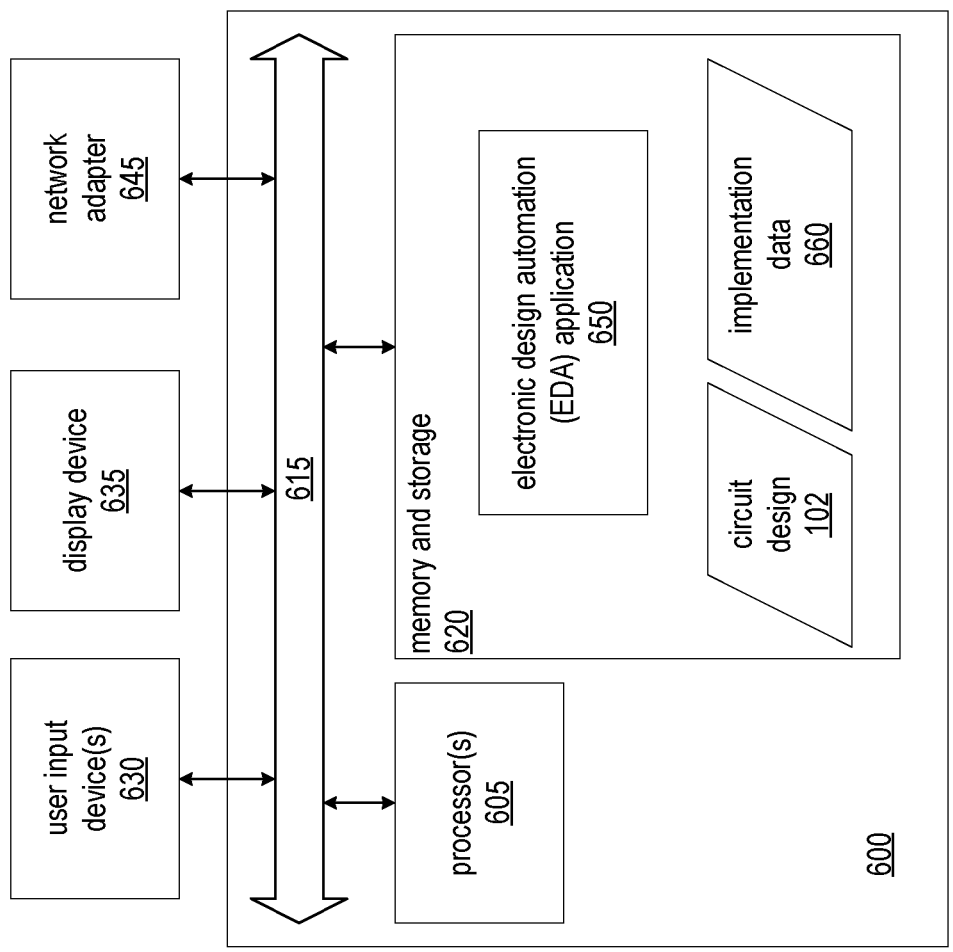
FIG. 6 is a block diagram illustrating an exemplary data processing system.

FIG. 6 is a block diagram illustrating an exemplary data processing system (system) 600. System 600 is an example of an EDA system. As pictured, system 600 includes at least one processor circuit (or "processor"), e.g., a central processing unit (CPU) 605 coupled to memory and storage arrangement 620 through a system bus 615 or other suitable circuitry. System 600 stores program code and circuit design 100 within memory and storage arrangement 620. Processor 605 executes the program code accessed from the memory and storage arrangement 620 via system bus 615. In one aspect, system 600 is implemented as a computer or other data processing system that is suitable for storing and/or executing program code. It should be appreciated, however, that system 600 can be implemented in the form of any system including a processor and memory that is capable of performing the functions described within this disclosure.

Memory and storage arrangement 620 includes one or more physical memory devices such as, for example, a local memory (not shown) and a persistent storage device (not shown). Local memory refers to random access memory or other non-persistent memory device(s) generally used during actual execution of the program code. Persistent storage can be implemented as a hard disk drive (HDD), a solid state drive (SSD), or other persistent data storage device. System 600 may also include one or more cache memories (not shown) that provide temporary storage of at least some program code and data in order to reduce the number of times program code and data must be retrieved from local memory and persistent storage during execution.

Input/output (I/O) devices such as user input device(s) 630 and a display device 635 may be optionally coupled to system 600. The I/O devices may be coupled to system 600 either directly or through intervening I/O controllers. A network adapter 645 also can be coupled to system 600 in order to couple system 600 to other systems, computer systems, remote printers, and/or remote storage devices through intervening private or public networks. Modems, cable modems, Ethernet cards, and wireless transceivers are examples of different types of network adapter 645 that can be used with system 600.

Memory and storage arrangement 620 may store an EDA application 650. EDA application 650, being implemented in the form of executable program code, is executed by processor(s) 605. As such, EDA application 650 is considered part of system 600. System 600, while executing EDA application 650, receives and operates on circuit design 100. In one aspect, system 600 performs a design flow on circuit design 100, and the design flow may include synthesis, mapping, placement, routing, and the generation of implementation data 660.

EDA application 650, circuit design 100, circuit design 660, and any data items used, generated, and/or operated upon by EDA application 650 are functional data structures that impart functionality when employed as part of system 600 or when such elements, including derivations and/or modifications thereof, are loaded into an IC such as a programmable IC causing implementation and/or configuration of a circuit design within the programmable IC.

Though aspects and features may in some cases be described in individual figures, it will be appreciated that features from one figure can be combined with features of another figure even though the combination is not explicitly shown or explicitly described as a combination.

The methods and system are thought to be applicable to a variety of EDA systems for. Other aspects and features will be apparent to those skilled in the art from consideration of the specification. It is intended that the specification and drawings be considered as examples only, with a true scope of the invention being indicated by the following claims.

What is claimed is:

1. A method comprising:
   interrupting processing of a circuit design by an electronic design automation (EDA) tool executing on a computer system at a selected phase of a plurality of phases of processing;
   serializing EDA state data into serialized state data while processing by the EDA tool is interrupted;
   writing the serialized state data by the EDA tool;
   reading the serialized state data and deserializing the serialized state data into memory of the computer system by the EDA tool;
   bypassing one or more phases of processing of the plurality of phases of processing after reading the serialized state data; and
   resuming processing of the circuit design by the EDA tool at the selected phase of processing after bypassing the one or more phases of processing.

2. The method of claim 1, wherein the interrupting includes interrupting the processing in response to an interactively input parameter to the EDA tool.

3. The method of claim 1, wherein:
   the interrupting processing includes interrupting processing of the circuit design at two or more selected phases of the plurality of phases of processing;
   the serializing includes serializing EDA state data into respective serialized state data sets while processing by the EDA tool is interrupted at the two or more selected phases;
   the writing includes writing the respective serialized state data sets to a storage arrangement by the EDA tool;
   the reading and deserializing includes reading one of the respective serialized state data sets from the storage arrangement and deserializing the one serialized state data set in response to an interactively input parameter that references one of the two or more selected phases;
   the bypassing includes bypassing one or more phases of processing of the plurality of phases of processing after reading the one serialized state data set; and
   the resuming processing includes resuming processing at the one of the two or more selected phases of processing after bypassing the one or more phases of processing.

4. The method of claim 3, wherein the interrupting includes interrupting the processing in response to input to the EDA tool of two or more interactively input parameters referencing the two or more selected phases of processing.

5. The method of claim 3, wherein the plurality of phases include two or more of placer initialization, floorplanning, global placement, detailed placement, and clock placement.

6. The method of claim 3, wherein:
   the writing includes writing to the storage arrangement, identification data associated with each serialized data set of the respective serialized state data sets; and
   the reading includes selecting the one of the respective serialized state data sets having associated identification data consistent with the input parameter.

7. The method of claim 1, further comprising testing whether or not the EDA tool maintains correct serialization before the processing of the circuit design.

8. The method claim 7, wherein the testing includes comparing actual sizes of data structures of the EDA tool to expected sizes of the data structures.

9. The method of claim 1, further comprising:
   writing to a storage arrangement, phase identification data that identify the selected phase of processing after the interrupting the processing;
   reading the phase identification data from the storage arrangement before the resuming of the processing; and
   wherein the resuming of the processing includes determining the selected phase from the phase identification data.

10. The method of claim 1, wherein:
    the serializing and the writing are performed by a parent process of the EDA tool; and
    the reading, bypassing, and resuming are performed by child processes of the EDA tool.

11. The method of claim 1, wherein the plurality of phases of processing include synthesis, placement, and routing.

12. The method of claim 1, further comprising generating implementation data; and
    making an integrated circuit based on the implementation data to implement the circuit design on the integrated circuit.

13. The method of claim 1, wherein:
    the serializing and the writing are performed by a parent process of the EDA tool;
    the reading, bypassing, and resuming are performed by a plurality of child processes of the EDA tool; and
    the method further comprises:
      generating respective placement results by the plurality of child processes;
      serializing EDA state data into respective child serialization data sets by the plurality of child processes;
      selecting and deserializing one of the child serialization data sets by the parent process based on evaluation of the respective placement results; and
      resuming processing by the parent process after deserializing the one of the child serialization data sets.

14. A system comprising:
    a processor arrangement;
    a memory arrangement coupled to the processor arrangement and configured with instructions that when executed by the processor arrangement cause the processor arrangement to execute an electronic design automation (EDA) tool that performs operations including:
      interrupting processing of a circuit design at a selected phase of a plurality of phases of processing;
      serializing EDA state data into serialized state data while processing is interrupted;
      writing the serialized state data;
      reading the serialized state data and deserializing the serialized state data into the memory arrangement;
      bypassing one or more phases of processing of the plurality of phases of processing after reading the serialized state data; and
      resuming processing of the circuit design at the selected phase of processing after bypassing the one or more phases of processing.

15. The system of claim 14, wherein the instructions for interrupting include instructions that cause the EDA tool to interrupt the processing in response to an interactively input parameter.

16. The system of claim 14, wherein:
    the instructions for interrupting processing include instructions that cause the EDA tool to interrupt processing of the circuit design at two or more selected phases of the plurality of phases of processing;

the instructions for serializing include instructions that cause the EDA tool to serialize EDA state data into respective serialized state data sets while interrupted at the two or more selected phases;

the instructions for writing include instructions that cause the EDA tool to write the respective serialized state data sets to a storage arrangement;

the instructions for reading and deserializing include instructions that cause the EDA tool to read one of the respective serialized state data sets from the storage arrangement and deserializing the one serialized state data set in response to an interactively input parameter that references one of the two or more selected phases;

the instructions for bypassing include instructions that cause the EDA tool to bypass one or more phases of processing of the plurality of phases of processing after reading the one serialized state data set; and the instructions for resuming processing include instructions that cause the EDA tool to resume processing at the one of the two or more selected phases of processing after bypassing the one or more phases of processing.

17. The system of claim 16, wherein the instructions for interrupting include instructions that cause the EDA tool to interrupt the processing in response to input of two or more interactively input parameters referencing the two or more selected phases of processing.

18. The system of claim 16, wherein:

the instructions for writing include instructions that cause the EDA tool to write to the storage arrangement, identification data associated with each serialized data set of the respective serialized state data sets; and the instructions for reading include instructions that cause the EDA tool to select the one of the respective serialized state data sets having associated identification data consistent with the input parameter.

19. The system of claim 14, wherein the plurality of phases include two or more of placer initialization, floor-planning, global placement, detailed placement, and clock placement.

20. The system of claim 14, wherein:

the instructions for serializing and the instructions for writing are performed by a parent process of the EDA tool;

the instructions for reading, bypassing, and resuming are performed by a plurality of child processes of the EDA tool; and the memory circuit is configured with instructions that when executed by the processor arrangement EDA tool to perform operations including:

generating respective placement results by the plurality of child processes;

serializing EDA state data into respective child serialization data sets by the plurality of child processes;

selecting and deserializing one of the child serialization data sets by the parent process based on evaluation of the respective placement results; and resuming processing by the parent process after deserializing the one of the child serialization data sets.

* * * * *